(12) United States Patent
Megrant

(10) Patent No.: US 10,957,841 B2
(45) Date of Patent: Mar. 23, 2021

(54) CAPPING LAYER FOR REDUCING ION MILL DAMAGE

(71) Applicant: Google LLC, Mountain View, CA (US)

(72) Inventor: Anthony Edward Megrant, Mountain View, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 16/333,505

(22) PCT Filed: Sep. 15, 2016

(86) PCT No.: PCT/US2016/051910
§ 371 (c)(1),
(2) Date: Mar. 14, 2019

(87) PCT Pub. No.: WO2018/052424
PCT Pub. Date: Mar. 22, 2018

(65) Prior Publication Data
US 2019/0259931 A1    Aug. 22, 2019

(51) Int. Cl.
*H01L 39/02* (2006.01)
*G06N 10/00* (2019.01)
(Continued)

(52) U.S. Cl.
CPC .......... *H01L 39/025* (2013.01); *G06N 10/00* (2019.01); *H01L 39/005* (2013.01); *H01L 39/02* (2013.01); *H01L 39/24* (2013.01); *H01L 39/2493* (2013.01)

(58) Field of Classification Search
None
See application file for complete search history.

(56) References Cited

U.S. PATENT DOCUMENTS 4,904,619 A * 2/1990 Yamada ............... H01L 39/2493
148/DIG. 89
5,512,514 A 4/1996 Lee et al.
(Continued)

FOREIGN PATENT DOCUMENTS

JP    S 61-024289    2/1986
JP    S 61-035577    2/1986
(Continued)

OTHER PUBLICATIONS

KR Office Action in Korean Appln. No. 10-2019-7009526, dated Mar. 19, 2020, 14 pages (with English translation).
(Continued)

*Primary Examiner* — Sitaramarao S Yechuri
(74) *Attorney, Agent, or Firm* — Fish & Richardson P.C.

(57) ABSTRACT

A method of fabricating an electrical contact junction that allows current to flow includes: providing a substrate including a first layer of superconductor material; removing a native oxide of the superconductor material of the first layer from a first region of the first layer; forming a capping layer in contact with the first region of the first layer, in which the capping layer prevents reformation of the native oxide of the superconductor material in the first region; forming, after forming the capping layer, a second layer of superconductor material that electrically connects to the first region of the first layer of superconductor material to provide the electrical contact junction that allows current to flow.

30 Claims, 5 Drawing Sheets

(51) Int. Cl.
  *H01L 39/00* (2006.01)
  *H01L 39/24* (2006.01)

(56) References Cited

U.S. PATENT DOCUMENTS

| | | |
|---|---|---|
| 2003/0071258 A1 | 4/2003 | Zagoskin et al. |
| 2003/0183935 A1* | 10/2003 | Herr ........................ H01L 27/18 257/758 |
| 2003/0207766 A1 | 11/2003 | Esteve et al. |
| 2015/0179918 A1* | 6/2015 | Greer ................. H01L 39/2493 505/329 |
| 2017/0033273 A1* | 2/2017 | Chang ................... H01L 39/223 |
| 2017/0133576 A1* | 5/2017 | Marcus ................. C23C 14/225 |

FOREIGN PATENT DOCUMENTS

| | | |
|---|---|---|
| JP | 2005-524980 | 8/2005 |
| JP | 2008-182157 | 8/2008 |
| JP | 2015-511067 | 4/2015 |
| JP | 2005-353787 | 12/2015 |
| KR | 10-2003-0005600 | 1/2003 |
| KR | 10-2015-0127046 | 11/2015 |

OTHER PUBLICATIONS

EP Extended European Search Report in European Appln. No. 20171274.2, dated May 18, 2020, 5 pages.
CA Office Action in Canadian Appln. No. 3036489, dated May 22, 2020, 4 pages.
PCT International Preliminary Report on Patentability in International Appln No. PCT/US2016/05191, dated Aug. 27, 2018, 5 pages.
PCT International Search Report and Written Opinion in International Appln No. PCT/US2016/051910, dated Jun. 5, 2017, 12 pages.
JP Office Action in Japanese Appln. No. 2019-514274, dated Jun. 8, 2020, 9 pages (with English translation).
JP Decision to Grant a Patent in Japanese Appln. No. 2019-514274, dated Oct. 5, 2020, 5 pages (with English translation).
KR Allowance of Patent in Korean Appln. No. 10-2019-7009526, dated Oct. 21, 2020, 3 pages (with English translation).

* cited by examiner

US 10,957,841 B2

CAPPING LAYER FOR REDUCING ION MILL DAMAGE

CROSS-REFERENCE TO RELATED APPLICATION

This application is a National Stage Application under 35 U.S.C. § 371 and claims the benefit of International Application No. PCT/US2016/051910, filed Sep. 15, 2016. The disclosure of the foregoing application is hereby incorporated by reference in its entirety.

TECHNICAL FIELD

The present disclosure relates to capping layers for reducing ion mill damage.

BACKGROUND

Quantum computing is a relatively new computing method that takes advantage of quantum effects, such as superposition of basis states and entanglement to perform certain computations more efficiently than a classical digital computer. In contrast to a digital computer, which stores and manipulates information in the form of bits (e.g., a "1" or "0"), quantum computing systems can manipulate information using qubits. A qubit can refer to a quantum device that enables the superposition of multiple states (e.g., data in both the "0" and "1" state) and/or to the superposition of data, itself, in the multiple states. In accordance with conventional terminology, the superposition of a "0" and "1" state in a quantum system may be represented, e.g., as $\alpha|0\rangle + \beta|1\rangle$. The "0" and "1" states of a digital computer are analogous to the $|0\rangle$ and $|1\rangle$ basis states, respectively of a qubit. The value $|\beta|^2$ represents the probability that a qubit is in $|0\rangle$ state, whereas the value $|\beta|^2$ represents the probability that a qubit is in the $|1\rangle$ basis state.

SUMMARY

In general, in some aspects, the subject matter of the present disclosure may be embodied in methods of fabricating an electrical contact junction that allows current to flow includes: providing a substrate including a first layer of superconductor material; removing a native oxide of the superconductor material of the first layer from a first region of the first layer; forming a capping layer in contact with the first region of the first layer, in which the capping layer prevents reformation of the native oxide of the superconductor material in the first region; forming, after forming the capping layer, a second layer of superconductor material that electrically connects to the first region of the first layer of superconductor material to provide the electrical contact junction that allows current to flow.

Implementations of the methods may include one or more of the following features. For example, in some implementations, removing the native oxide comprises ion milling the first region of the first layer of superconductor material.

In some implementations, removing the native oxide from the first region of the first layer of superconductor material comprises: applying a first photoresist layer to the first layer of superconductor material; patterning the first photoresist layer to expose the first region of the first layer of superconductor material; and ion milling the exposed first region of the first layer of superconductor material. Forming the capping layer may include: forming the capping layer on the patterned first photoresist layer such that part of the capping layer is in direct contact with the ion milled exposed first region of the first layer of superconductor material; and removing a section of the capping layer that is not in direct contact with the ion milled exposed first region of the first layer of superconductor material. Forming the second layer of superconductor material may include: applying a second photoresist layer; patterning the second photoresist layer to expose the capping layer and a portion of the substrate surface; and forming the second layer of superconductor material on the capping layer and the exposed portion of the substrate surface. Forming the second layer of superconductor material may include: applying a second photoresist layer; patterning the second photoresist layer to expose the capping layer and a portion of the substrate surface; removing the capping layer to expose the portion of the first layer without the native oxide; and forming the second layer of superconductor material on the exposed first region of the first layer without the native oxide and on the exposed portion of the substrate surface.

In some implementations, the capping layer includes a material that, when subject to ion milling at a predetermined set of ion beam parameters, has an etch rate that is higher than an etch rate of the native oxide subject to the same predetermined set of ion beam parameters. The predetermined set of ion beam parameters may include a beam voltage, a beam current, and a beam width. The etch rate of the capping layer material may be at least five times higher than the etch rate of the native oxide. The etch rate of the capping layer material may be at least fifteen times higher than the etch rate of the native oxide. The capping layer material may include silver or gold. The capping layer material may include a metal having a thickness such that the metal behaves as a superconductor material due to the superconductivity proximity effect when the electrical contact junction is cooled below a critical temperature of the superconductor material of the first layer. The thickness of the metal may be between about 5 nm and about 10 nm. The capping layer material may include a superconductor material. The superconductor material of the capping layer may include titanium nitride, rhenium, or ruthenium.

In some implementations, the superconductor material of the first layer includes aluminum.

In some implementations, the superconductor material of the second layer includes aluminum.

In general, in another aspect, the subject matter of the present disclosure may be embodied in devices that include: a substrate; a first layer of superconductor material on the substrate, the first layer of superconductor material having first and second opposing surfaces, in which the second surface faces away from the substrate; a capping layer in direct contact with the second surface of the first layer of superconductor material, in which the capping layer inhibits formation of a native oxide on the first layer, and in which a region of the second surface of the first layer of superconductor material in contact with the capping layer is free of a native oxide of the superconductor material; and a second layer of superconductor material in direct contact with the capping layer.

The devices may have one or more of the following features. For example, in some implementations, the first layer of superconductor material, the capping layer, and the second layer of superconductor material form the electrical contact junction that allows DC current to flow unimpeded.

In some implementations, the capping layer includes a material that may be associated with an ion milling etch rate that, at a set of predetermined ion beam parameters, is higher than an ion milling etch rate associated with the native oxide of the superconductor material of the first layer at the same set of predetermined ion beam parameters. The set of predetermined ion beam parameters may include a beam voltage, a beam current, and a beam width. The etch rate associated with the capping layer material may be at least five times higher than the etch rate of the native oxide of the superconductor material of the first layer. The etch rate associated with the capping layer material may be at least fifteen times higher than the etch rate of the native oxide of the superconductor material of the first layer. The capping layer material may include silver or gold. The capping layer material may include a metal having a thickness such that the metal behaves as a superconductor material due to the superconductivity proximity effect when the electrical contact junction is cooled below a critical temperature of the superconductor material of the first layer. The thickness of the metal may be between about 5 nm and about 10 nm. The capping layer material may include a superconductor material. The capping layer material may include titanium nitride, rhenium, or ruthenium.

In some implementations, the superconductor material of the first layer may be aluminum.

In some implementations, the superconductor material of the second layer may be aluminum.

In some implementations, the device may be a qubit.

In some implementations, the device may be a capacitor.

In some implementations, the device may be a cross-over bridge.

Implementations may include one or more of the following advantages. For example, in some implementations, the capping layer prevents the reformation of a native oxide on the underlying superconductor. In some implementations, an opening region in which the capping layer is formed may be provided only above an area of the base layer to be contacted (with a removable resist protecting other areas of the device), such that any residue that is formed as a result of ion milling is confined to the opening region. Additionally, since contamination on a metal/superconductor surface of the base layer may not store as much energy as the dielectric surface of the substrate (due to different relative permittivities between vacuum (1) and the substrate materials), the residue may precipitate less on the base layer surface than it would on the substrate surface that is protected by the resist. Additionally, in some implementations, residue that is formed in the opening region may be buried between the base layer and the subsequent junction metal/superconductor layer to be deposited.

For the purposes of this disclosure, a superconductor (alternatively, superconducting) material may be understood as a material that exhibits superconducting properties at or below a superconducting critical temperature. Examples of superconductor material include aluminum (superconducting critical temperature of, e.g., 1.2 kelvin), niobium (superconducting critical temperature of, e.g., 9.3 kelvin) and titanium nitride (superconducting critical temperature of, e.g., 5.6 kelvin).

The details of one or more implementations are set forth in the accompanying drawings and the description below. Other features and advantages will be apparent from the description, the drawings, and the claims.

DETAILED DESCRIPTION

Figure 1A:
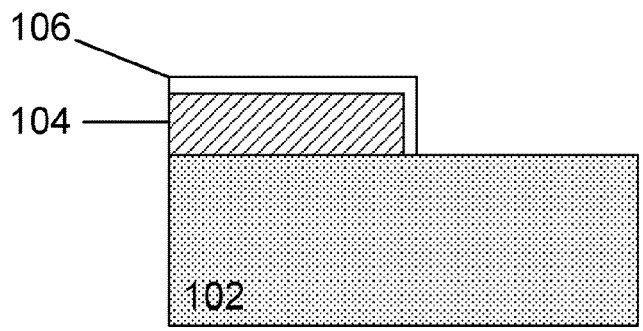
FIGS. 1A-1D are schematics that illustrate an example of a process, and the resulting damage, in which ion milling is used to remove a native oxide from a superconductor base layer.

Quantum computing entails coherently processing quantum information stored in the quantum bits (qubits) of a quantum computer. In certain types of quantum computing processors, such as quantum annealers, the qubits of the quantum processor are coupled together in a controllable manner such that the quantum state of each qubit affects the corresponding quantum states of the other qubits to which it is coupled. Superconducting quantum computing is a promising implementation of quantum computing technology in which quantum circuit elements are formed, in part, from superconductor materials. Superconducting quantum computers are typically multilevel systems, in which only the first two levels are used as the computational basis. In certain implementations, quantum circuit elements, such as qubits, are operated at very low temperatures so that superconductivity can be achieved and so that thermal fluctuations do not cause transitions between energy levels. It may be preferable that the quantum circuit elements are operated with low energy loss and dissipation (e.g., the quantum circuit elements exhibit a high quality factor, Q) to avoid, e.g., quantum decoherence. Factors that may lead to energy loss and/or decoherence include, e.g., material defects, electron system excitations, and undesired radiative coupling.

Superconductor material may be used to form various quantum circuit elements and components such as, e.g., Josephson junctions, superconducting co-planar waveguides, quantum LC oscillators, qubits (e.g., flux qubits or charge qubits), superconducting quantum interference devices (SQUIDs) (e.g., RF-SQUID or DC-SQUID), inductors, capacitors, transmission lines, ground planes, among others. The fabrication of certain quantum circuit elements including, e.g., Josephson junctions, multi-level capacitors, and cross-over bridges (also sometimes referred to as airbridges), among others, may require multiple processing steps in which a first patterned superconductor layer is formed, and then directly contacted with a second patterned superconductor layer. To reduce loss and achieve a high quality factor, the interface between the two superconductor layers should provide a galvanic direct electrical contact, allowing DC current to flow with substantially no loss. The presence, however, of a native oxide at the interface between the superconductor layers can, in some implementations, inhibit the formation of the direct electrical and physical contact between the superconductor layers. For instance, the native oxide may function as an unintended capacitor and additional Josephson junction, and would therefore be a lossy element. Typically, such native oxides are relatively thin, e.g., on the order of several nanometers thick.

Without the presence of the native oxide between the superconductor layers, a DC current may flow unimpeded. Thus, to maintain the low loss direct electrical contact between the first and second superconductor material, the native oxide may be removed using techniques such as ion milling. Ion Milling is a physical etching technique whereby the ions of an inert gas (typically Ar) are accelerated from a wide beam ion source into the surface of a material in order to remove the material to some desired depth or underlayer. When using ion milling to remove the native oxide of a superconductor material, the ion bombardment also may attack other materials in the device, such as the substrate or dielectric layers, resulting in damage to those materials. Alternatively, or in addition, the ion bombardment may cause portions of photoresist that have been ion milled to redeposit on regions where the native oxide has been removed, as well as other areas of the substrate. The redeposited resist may become a hybrid material with the metal that is difficult or, in some instances, practically impossible to remove without damaging other areas of the substrate. In both cases (ion damage to other materials and residue being left on the device surface), the reduction in quality factor of devices that are ultimately fabricated with this technique can be substantial. An example of a superconductor material that may be used to form quantum circuit elements and that forms a native oxide is aluminum. Aluminum has a native oxide (e.g., $Al_2O_3$) that may be particularly difficult to remove with ion milling, thus requiring a relatively long time to etch. The longer the substrate or other layers are exposed to the ion bombardment, the worse the damage can be. For instance, in the case of aluminum, the ion milling may result in a reduction of quality factor by as much as ten times or more.

FIGS. 1A-1D illustrate an example of a process, and the resulting damage, in which ion milling is used to remove a native oxide from a superconductor base layer so that a galvanic direct electrical contact can be formed with the base layer. In particular, the example process depicted in FIGS. 1A-1D illustrates a cross-section view of the formation of a portion of an xmon qubit. A circuit schematic of an example of an xmon qubit 200 is illustrated in FIG. 2A.

Figure 2A:
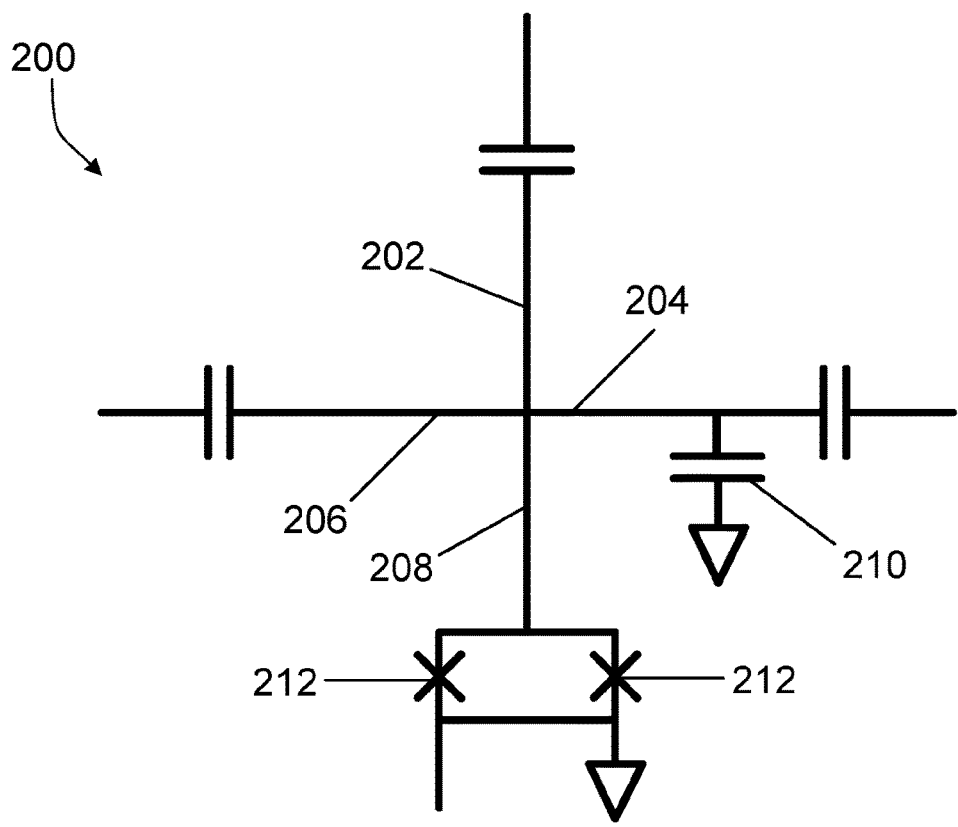
FIG. 2A is a circuit schematic of an example of an xmon qubit.
Figure 2B:
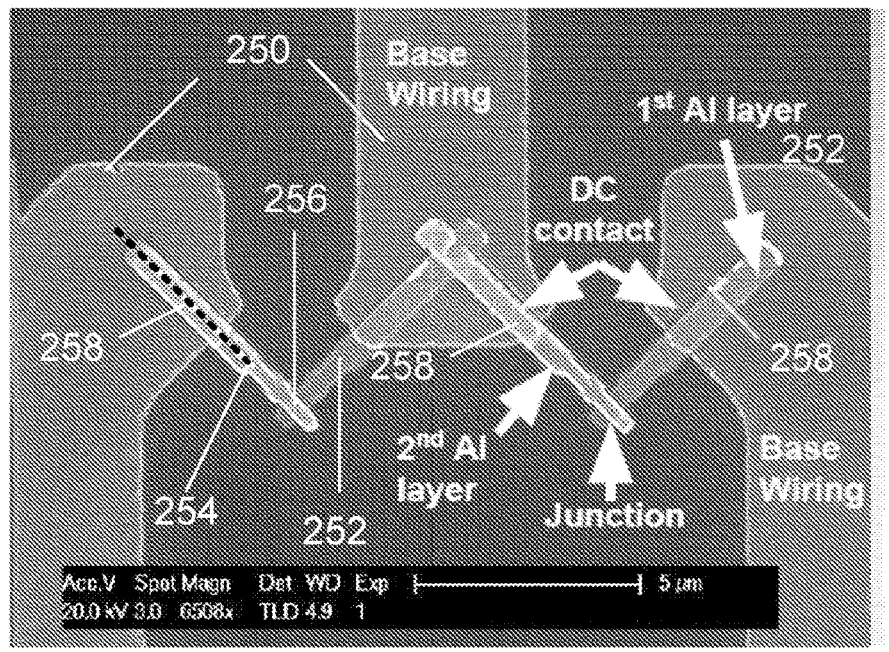
FIG. 2B is a scanning electron microscope photograph that shows an example of a portion of an xmon qubit.

An xmon qubit typically includes a planar structure having four arms, each serving a different function. For example, referring to FIG. 2A, a first arm 202 of the xmon qubit may be provided for coupling to measurement readout resonator; a second arm 204 may be provided for coupling to one or more other qubits through, e.g., a quantum bus resonator; a third arm 206 may provide XY control to excite a qubit state; and a fourth arm 208 may provide Z control to tune the qubit frequency. At the end of the fourth arm 208, the xmon qubit may include a tunable Josephson junction, formed by a ring shaped SQUID. The ring is intersected by two tunnel junctions 212, and tied to ground and the Z control line. The crossing of the four arms provides the qubit capacitance 210. The other capacitors shown in FIG. 2A represent the coupling capacitance to other elements, such as the readout resonator, the XY drive, and the quantum bus. FIG. 2B is a scanning electron micrograph illustrating a top view of the regions where the Josephson junctions are formed in an example xmon qubit. As shown in the example of FIG. 2B, multiple layers of superconductor material, such as aluminum, may be used to form the qubit: a base aluminum wiring layer 250, a first aluminum layer 252 formed on the surface of the base aluminum wiring layer 250, and a second aluminum layer 254 formed on the surface of the first aluminum layer 252. The Josephson junctions 256 are formed between the first aluminum layer 252 and the second aluminum layer 254 by oxidizing the surface of the first aluminum layer 252 that contacts the second aluminum layer 254. To inhibit the formation of other unintended Josephson junctions, the regions 258 where the first aluminum layers 252 and second aluminum layers 254 overlap the base aluminum wiring layers 250 should provide a direct electrical contact that allows DC current to flow unimpeded.

The fabrication process depicted in FIGS. 1A-1D is focused on the formation of one of the regions 258 (identified in FIG. 2B by the black dashed line) of the xmon qubit where a first aluminum wiring layer is contacted with a second aluminum layer of wiring.

As shown in FIG. 1A, a substrate 102 having a base layer 104 is provided. The base layer 104 may be formed from a superconductor material. For example, the base layer 104 may be formed from aluminum, niobium, or titanium nitride. The base layer 104 may be patterned (using, e.g., photolithography and etching or lift-off techniques) to define a first portion of the junction. The substrate 102 on which the base layer 104 is formed may include a dielectric material, such as silicon or sapphire. For example, in some implementations, the substrate 102 may be a silicon or sapphire wafer.

Figure 1B:
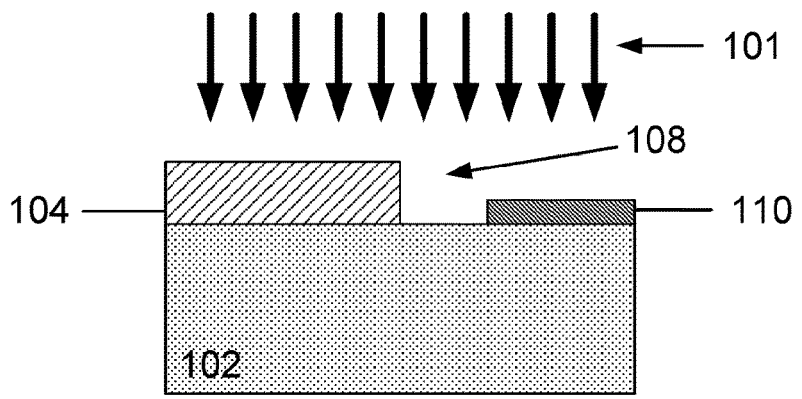
Figure 1C:
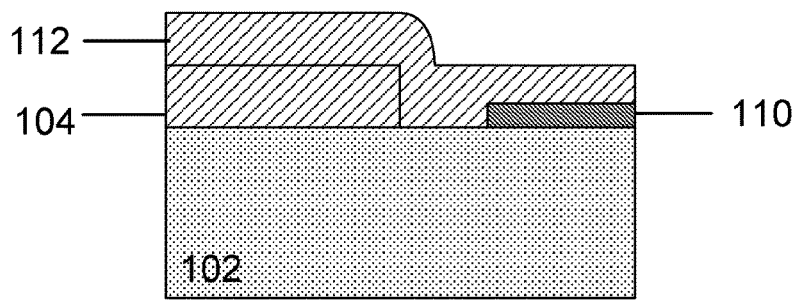
Figure 1D:
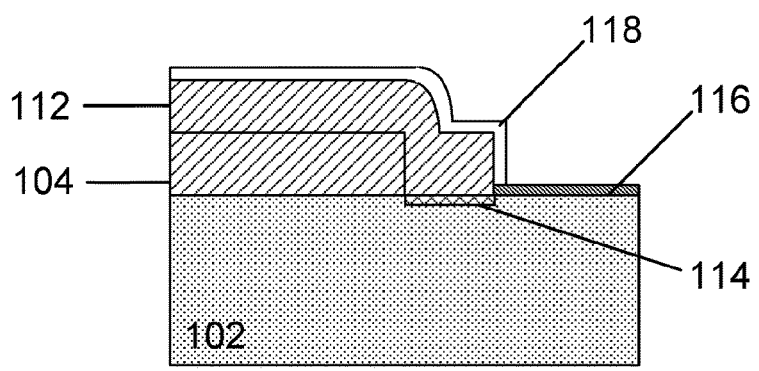
Figure 3:
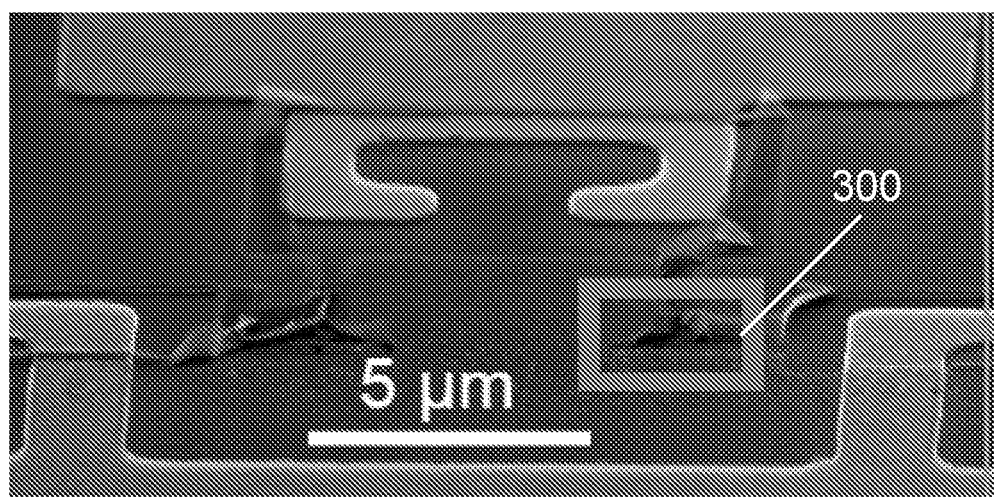
FIG. 3 is a scanning electron microscope photograph that shows an example of an xmon qubit.

Processing of the substrate 102 and base layer 104 occurs, in part, at or near standard ambient temperature and pressure (e.g., 25° C. and 1 bar). As a result, the superconductor material of the base layer 104 may form a relatively thin native oxide 106 on its surface that is exposed to the atmosphere. As explained herein, ion milling may be used to remove the native oxide 106 in the area to which the electrical contact having no impedance is desired. For example, as shown in FIG. 1B, ion milling 101 may be applied to a region 108 of the base layer 104 and the substrate 102 that is defined by a patterned photoresist layer 110 in order to remove the native oxide 106. In the case of an aluminum base layer, an Ar ion mill may be applied for approximately three minutes with the following beam parameters to remove the native aluminum oxide: 400 V, 21 mA, and beam width of about 3.2". Following the ion milling step, a second layer 112 of superconductor material may be formed on the region 108 so that a direct electrical contact that allows DC current to flow unimpeded is made with the base layer 104, as shown in FIG. 1C. Then, undesired portions of the second superconductor layer 112 are removed. For example, as shown in FIG. 1D, the portions of the second superconductor layer 112 outside of region 108 are removed using a lift-off process. As shown in FIG. 1D, the second superconductor layer 112 may have its own native oxide layer 118. The foregoing process may result in substantial damage to the substrate (region 114) and leave re-deposited resist as a residue 116, both of which can increase the loss, and therefore reduce the quality factor, associated with the circuit element being formed. FIG. 3 is a scanning electron microscope photograph that shows an example of substrate surface damage that may result from ion milling to remove a native oxide during the formation of an xmon qubit. A region 300 of damage is highlighted.

Figure 4A:
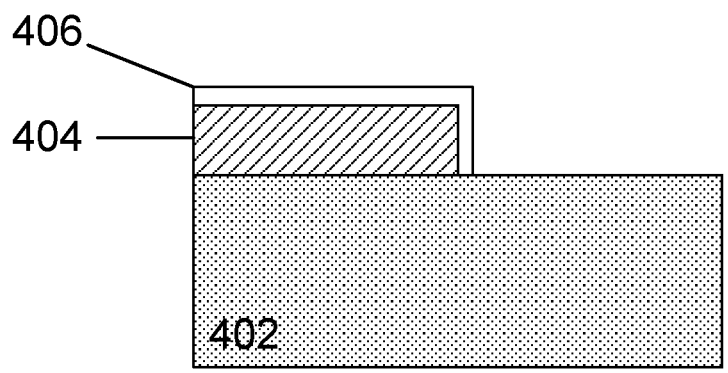
FIGS. 4A-4F are schematics that illustrate an example of a process in which ion milling and a capping layer are used to remove a native oxide from a superconductor base layer.

To reduce the loss associated with ion milling, a capping layer may be introduced, in which the capping layer prevents the re-formation of the native oxide and allows the process to be modified to avoid ion milling induced damage and resist hardening. FIGS. 4A-4F are schematics that illustrate an example of a process in which ion milling and a capping layer are used to remove a native oxide from a superconductor base layer so that an electrical contact with no impedance can be formed with the base layer. In particular, the example process depicted in FIGS. 4A-1F illustrates a cross-section view of the formation of a portion of an xmon qubit. However, the use of a capping layer as detailed herein may be applied during the formation of other devices as well, such as in the formation of superconductor quantum circuit elements including a capacitor or a cross-over bridge.

As shown in FIG. 4A, a substrate 402 having a base layer 404 is provided. The base layer 404 may be formed from a superconductor material. For example, the base layer 404 may be formed from aluminum, niobium, or titanium nitride. The base layer 404 may be patterned (using, e.g., photolithography and etching or lift-off techniques) to define a first portion of the junction. As in the example of FIGS. 1A-1D, the superconductor material of the baser layer 404 forms a native oxide 406. The substrate 402 on which the base layer 404 is formed may include a dielectric material, such as silicon or sapphire. For example, in some implementations, the substrate 402 may be a silicon or sapphire wafer.

Figure 4B:
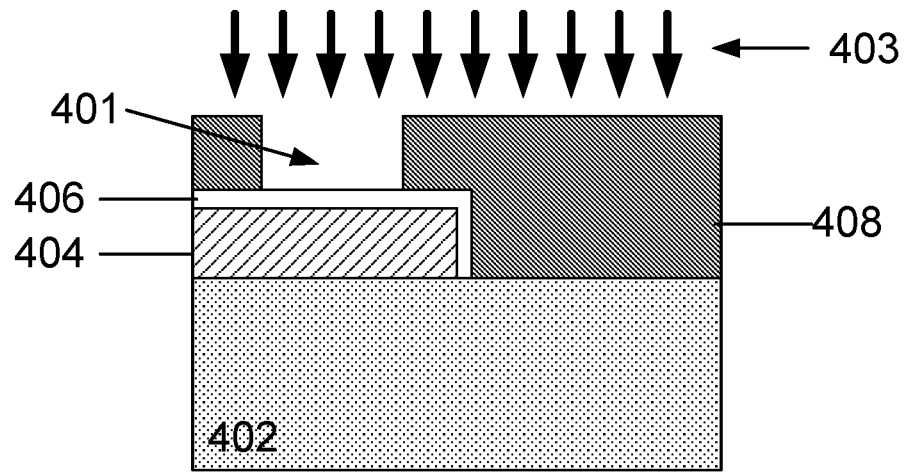

In a next step, as shown in FIG. 4B, a photoresist layer 408 is deposited and patterned to define an opening region 401 that exposes a portion of the base layer 404. In contrast to the process of FIGS. 1A-1D, the opening region 401 may be defined only above an area of the base layer 404 to which contact will be made with the second superconductor layer. The other portions of the base layer 404 and the substrate 402 are covered with the photoresist layer 408. Other areas of the device may be protected with the photoresist layer 408 as well.

The native oxide 406 of the base layer 404 in the opening region 401 then may be removed using ion milling 403. For example, the base layer 404 may include aluminum and the ion milling may remove a native aluminum oxide from the base layer 404. Because of the presence of photoresist layer 408, the ions are prevented from impinging on, and thus damaging, the surfaces of permanent structures, such as the substrate 402 or other layers of material that will be used to form circuit devices. Forming the opening region 401 only above an area of the base layer 404 to be contacted may have several advantages. For example, since the ion milling now occurs only on the top surface of the base layer 404 defined by the photoresist 408 (ion milling of the resist itself can be ignored), any residue that forms may be confined to the opening region 401. This may be advantageous because contamination on the metal/superconductor surface of the base layer 404 does not store as much energy as the dielectric surface of the substrate (due to the different relative permittivities between vacuum (1) and the substrate materials (approximately 10-11 for sapphire and silicon)). Accordingly, the residue is thought to precipitate less on the base layer surface than it would on the substrate surface. Additionally any remaining residues may be buried between the base layer 404 and the subsequent junction metal/superconductor layer to be deposited. In some implementations, this eliminates energy stored in the opening region 401 since the two metal/superconductor layers will be at the same potential due to the DC electrical contact. Furthermore, in some implementations, the metal/superconductor material that forms base layer 404 may etch at a lower rate than the substrate under ion milling and thus be less likely to form the photoresist residue composite that is difficult to remove.

Figure 4C:
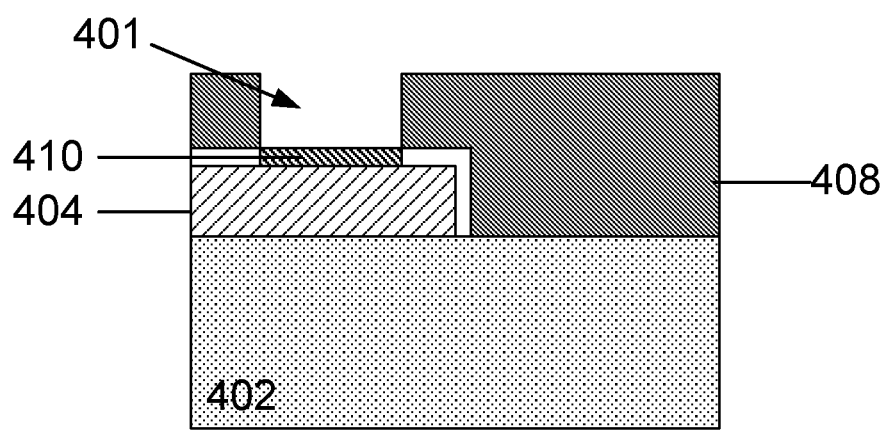

Following the removal of the native oxide, a capping layer 410 may be formed in the opening region 401 as shown in FIG. 4C. The capping layer 410 may be formed in contact with the surface of the base layer 404 from which the native oxide was removed. With the capping layer 410 in place, additional processing of the device may be performed without the native oxide reforming in region 401, when the device is exposed to atmospheric oxygen. Furthermore, the capping layer 410 may be formed from a material that is easier to remove than the native oxide. For instance, the capping layer 410 may be formed from a material that, when subject to ion milling at a predetermined set of ion beam parameters, has an etch rate that may be higher than an etch rate of the native oxide of the superconductor material of the base layer 404 when subject to ion milling at the same predetermined set of ion beam parameters. The predetermined set of ion beam parameters may include, e.g., a beam voltage, a beam current, and/or a beam width. In this way, when the capping layer 410 is removed, the technique used to remove the capping layer 410 (e.g., ion milling) may inflict less overall damage to the device than if it were the native oxide were being removed, since it may require less total time to remove the same thickness of material. The thinnest possible thickness for the capping layer 410 corresponds to the thickness that that keeps the native oxide from re-forming. This can be as small as several nanometers depending on the material and deposition parameters. In some implementations, the capping layer 410 may have thicknesses extending up to several microns or more.

The removal rate of the capping layer 410 relative to the removal rate of the native oxide under the same processing parameters may vary. For example, in some implementations, the capping layer 410 may be associated with an etch rate by ion milling that is at least two times higher, at least five times higher, at least ten times higher, at least fifteen times higher, or at least twenty times higher than an etch rate by ion milling associated with the native oxide of the superconductor material of the base layer 404 under the same predetermined set of ion milling beam parameters.

Table 1 shown below depicts various examples of etch rates of different materials subject to ion milling under the same beam parameters of 80 mA, 100 V acceleration, and a constant beam width. Values are rounded to the nearest 5 Å/min.

TABLE 1

| Material | Rate (Å/min.) |
| --- | --- |
| Ag | 100 |
| Al | 35 |
| Al/Cu | 5 |
| Al2O3 | 5 |
| Au | 90 |
| AZ 1350J | 15 |
| Bi | 430 |
| C | 5 |
| CdS | 50 |
| Co | 30 |
| Cr | 20 |
| CrSi | 5 |
| Cu | 50 |
| Er | 45 |
| Fe | 25 |
| FeO | 35 |
| GaAs | 115 |
| GaP | 70 |
| GaSb | 85 |
| Ge | 45 |
| InSb | 60 |
| Ir | 30 |
| LiNbO3 | 25 |
| Mn | 45 |
| Nb | 20 |
| Ni | 30 |
| NiCr | 10 |
| NiFe | 20 |
| NiFeCo | 5 |
| No | 20 |
| Pb | 155 |
| PbTe | 150 |
| Pd | 50 |
| PMMA | 20 |
| Pt | 45 |
| Rb | 200 |
| Re | 25 |
| Ru | 30 |

TABLE 1-continued

| Material | Rate (Å/min.) |
|---|---|
| Sb | 160 |
| Si | 20 |
| SiC | 15 |
| SiO2 | 25 |
| Si3N4 LPCVD | 5 |
| Sn | 70 |
| Th | 35 |
| Ti | 10 |
| V | 20 |
| W | 15 |

As can be seen from Table 1, aluminum oxide has an etch rate when subject to ion milling of about 5 Å/min. Various different materials may be selected as the capping layer material, which have a higher ion mill etch rate than aluminum oxide. In selecting the capping layer material, it may be advantageous, in some implementations, to select a material having a higher etch rate than materials (other than the capping layer 410) that also are subject to ion milling. For instance, in some implementations, regions other than the capping layer 410 may be subject to ion bombardment during removal of the capping layer 410. These other regions may include, for example, the substrate surface or other layers of the device. Examples of such materials include silicon and silicon oxide (e.g., $SiO_2$), which are associated with ion milling etch rates of 20 Å/min and 25 Å/min, respectively, as shown in Table 1. These other regions may not be protected by a temporary covering layer such as resist. By selecting a capping layer material that has an etch rate higher than the etch rate of the native oxide as well as higher than the etch rate of other materials exposed to the ion bombardment, the amount of undesired damage to those other materials may be reduced. This is because the capping layer material may be etched far quicker than the other materials exposed to the ion milling.

As examples, in some implementations, the capping layer 410 may be formed from silver (ion mill etch rate of 100 Å/min) or gold (ion mill etch rate of 90 Å/min). Alternatively, the capping layer 410 may be formed from superconductor materials. In some implementations, the capping layer 410 may be formed from superconductor materials that form no or minimal native oxides and still have a higher etch rate than the native oxide of the base layer material the capping layer 410 covers. For example, in some implementations, the capping layer 410 may be formed from titanium nitride, rhenium or ruthenium.

Figure 4D:
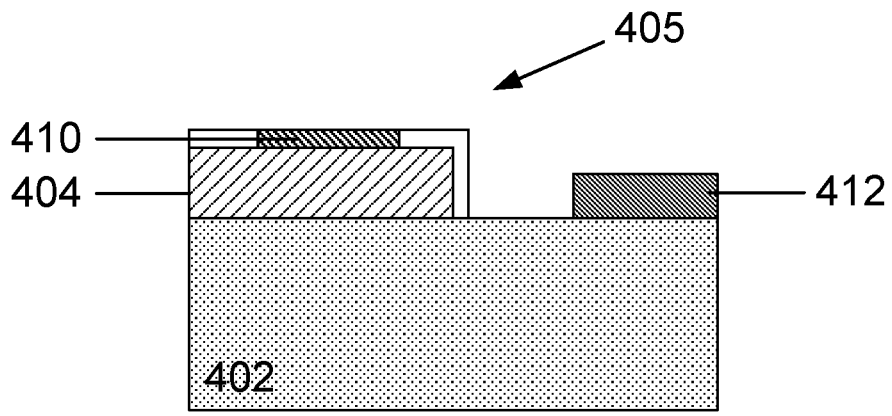

After forming the capping layer 410, the photoresist layer 408 defining the opening region 401 may be removed. For instance, the layer 408 may be removed by applying a photoresist stripper solution to the device or by performing $O_2$ ashing (also referred to as plasma ashing) of the resist. As shown in FIG. 4D, a second photoresist layer 412 then may be deposited and patterned to define the area 405 in which the second superconductor layer will be deposited. Prior to depositing the second superconductor layer, however, the capping layer 410 may be removed. As explained herein, the capping layer 410 may be removed using ion milling. Since the material of the capping layer 410 may be associated with a relatively high etch rate, the capping layer 410 may be removed quickly and without substantial damage resist hardening compared to the removal of the native oxide of the superconductor material of the base layer 404.

Figure 4E:
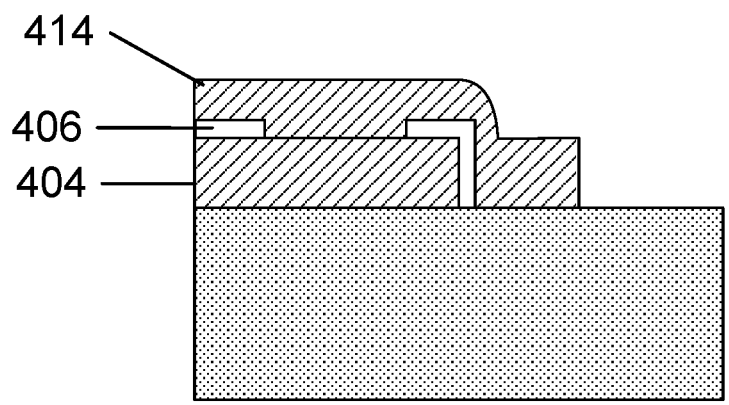

As shown in FIG. 4E, the second superconductor layer 414 then may be deposited and patterned so that it makes a direct electrical and physical contact with the base layer 404 and so that it contacts the substrate 402. The second superconductor layer 414 may be formed from the same material or different material from the base layer 404. For example, the second superconductor layer 414 may be formed from aluminum, titanium nitride, or niobium, among other materials. The second superconductor layer 414 may be patterned using, e.g., a lift-off process, where the undesired portions of the superconductor material are removed when the photoresist 412 is stripped. As shown in FIG. 4E, the second superconductor layer 414 may have its own native oxide layer 416.

Figure 4F:
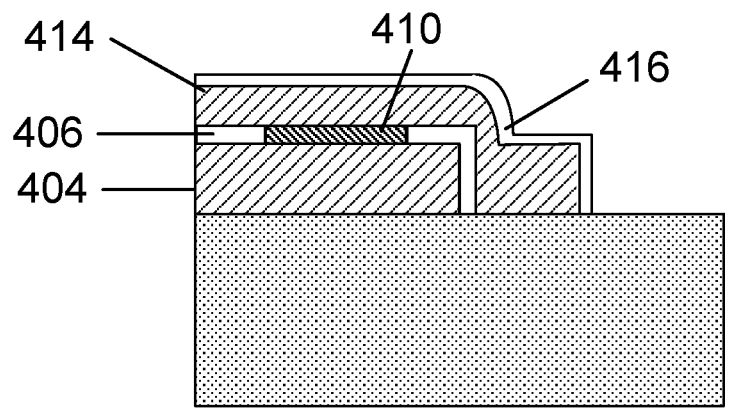

Alternatively, in some implementations, the capping layer 410 is not removed as shown in FIG. 4F. Instead, the second superconductor layer 414 may be formed on and in contact with the capping layer 410. A direct electrical contact that allows DC current to flow unimpeded is still possible between the base layer 404 and the second superconductor layer 414 if, e.g., the capping layer 410 is formed from a superconductor material. For instance, if a superconductor material with little or no native oxide (e.g., TiN, Re, or Ru) is selected as the capping layer 410, then the native oxide on the capping layer 410 itself may be removed with a relatively quick ion milling, leaving little damage or resist hardening.

In some implementations, the capping layer 410 may be formed from a metal having a thickness such that the metal behaves as a superconductor material due to the superconductivity proximity effect. The superconductivity proximity effect occurs when a superconductor material is placed in contact with a non-superconductor material (e.g., gold or silver), such that the non-superconductor material begins to exhibit zero or close to zero electrical resistance over mesoscopic distances. Typically, the proximity effect may be observed when two superconducting materials are separated by a thin film of a non-superconducting metal. In some implementations, the proximity effect may lead to a reduction in the critical temperature, $T_c$, of the superconductor(s) to which the non-superconductor is adjacent. Thicknesses that may allow the proximity effect to be leveraged in this way include between, e.g., about 5 nm to about several hundreds of nanometers (e.g., about 100 nm, about 200 nm, about 300 nm, about 400 nm, or about 500 nm). For instance, in some implementations, the thickness may be between about 5 nm and about 10 nm.

In the example shown in FIG. 4F, a metal, such as gold or silver, may be selected as the capping layer 410. By leaving the capping layer 410 in place, a direct electrical contact that allows DC current to flow unimpeded may still be maintained without having to perform a second ion milling step, thus further reducing potential damage and increasing the quality factor of the device being fabricated.

Processes described herein may entail the deposition of one or more materials, such as superconductors, dielectrics and/or metals. Depending on the selected material, these materials may be deposited using deposition processes such as chemical vapor deposition, physical vapor deposition (e.g., evaporation or sputtering), or epitaxial techniques, among other deposition processes. Processes described herein may also entail the removal of one or more materials from a device during fabrication. Depending on the material to be removed, the removal process may include, e.g., wet etching techniques, dry etching techniques, or lift-off processes.

Implementations of the quantum subject matter and quantum operations described in this specification may be implemented in suitable quantum circuitry or, more generally, quantum computational systems, including the structures disclosed in this specification and their structural equivalents, or in combinations of one or more of them. The term "quantum computational systems" may include, but is not limited to, quantum computers, quantum information processing systems, quantum cryptography systems, or quantum simulators.

The terms quantum information and quantum data refer to information or data that is carried by, held or stored in quantum systems, where the smallest non-trivial system is a qubit, e.g., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Quantum circuit elements may be used to perform quantum processing operations. That is, the quantum circuit elements may be configured to make use of quantum-mechanical phenomena, such as superposition and entanglement, to perform operations on data in a non-deterministic manner. Certain quantum circuit elements, such as qubits, may be configured to represent and operate on information in more than one state simultaneously. Examples of superconducting quantum circuit elements that may be formed with the processes disclosed herein include circuit elements such as co-planar waveguides, quantum LC oscillators, qubits (e.g., flux qubits or charge qubits), superconducting quantum interference devices (SQUIDs) (e.g., RF-SQUID or DC-SQUID), inductors, capacitors, transmission lines, ground planes, among others.

In contrast, classical circuit elements generally process data in a deterministic manner. Classical circuit elements may be configured to collectively carry out instructions of a computer program by performing basic arithmetical, logical, and/or input/output operations on data, in which the data is represented in analog or digital form. In some implementations, classical circuit elements may be used to transmit data to and/or receive data from the quantum circuit elements through electrical or electromagnetic connections. Examples of classical circuit elements that may be formed with the processes disclosed herein include rapid single flux quantum (RSFQ) devices, reciprocal quantum logic (RQL) devices and ERSFQ devices, which are an energy-efficient version of RSFQ that does not use bias resistors. Other classical circuit elements may be formed with the processes disclosed herein as well.

During operation of a quantum computational system that uses superconducting quantum circuit elements and/or superconducting classical circuit elements, such as the circuit elements described herein, the superconducting circuit elements are cooled down within a cryostat to temperatures that allow a superconductor material to exhibit superconducting properties.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. For example, the actions recited in the claims can be performed in a different order and still achieve desirable results. In certain circumstances, multitasking and parallel processing may be advantageous. Moreover, the separation of various components in the implementations described above should not be understood as requiring such separation in all implementations.

A number of implementations have been described. Nevertheless, it will be understood that various modifications may be made without departing from the spirit and scope of the invention. Other implementations are within the scope of the following claims.

What is claimed is:

1. A method of fabricating an electrical contact junction that allows a current to flow, the method comprising:
   providing a substrate comprising a first layer of superconductor material;
   removing a native oxide of the superconductor material of the first layer from a first region of the first layer, wherein removing the native oxide from the first region of the first layer of superconductor material comprises
      applying a first photoresist layer to the first layer of superconductor material,
      patterning the first photoresist layer to expose the first region of the first layer of superconductor material, and
      ion milling the exposed first region of the first layer of superconductor material;
   forming a capping layer in contact with the first region of the first layer, wherein the capping layer prevents reformation of the native oxide of the superconductor material in the first region, wherein forming the capping layer comprises
      forming the capping layer on the patterned first photoresist layer such that part of the capping layer is in direct contact with the ion milled exposed first region of the first layer of superconductor material, and
      removing a section of the capping layer that is not in direct contact with the ion milled exposed first region of the first layer of superconductor material;
   forming, after forming the capping layer, a second layer of superconductor material that electrically connects to the first region of the first layer of superconductor material to provide the electrical contact junction that allows current to flow.

2. The method of claim 1, wherein forming the second layer of superconductor material comprises:
   applying a second photoresist layer;
   patterning the second photoresist layer to expose the capping layer and a portion of a substrate surface; and forming the second layer of superconductor material on the capping layer and an exposed portion of the substrate surface.

3. The method of claim 1, wherein forming the second layer of superconductor material comprises:
applying a second photoresist layer;
patterning the second photoresist layer to expose the capping layer and a portion of a substrate surface;
removing the capping layer to expose the first region of the first layer without the native oxide; and
forming the second layer of superconductor material on the exposed first region of the first layer without the native oxide and on the exposed portion of the substrate surface.

4. The method of claim 1, wherein the capping layer comprises a material that, when subject to ion milling at a predetermined set of ion beam parameters, has an etch rate that is higher than an etch rate of the native oxide subject to the same predetermined set of ion beam parameters.

5. The method of claim 4, wherein the predetermined set of ion beam parameters comprises a beam voltage, a beam current, and a beam width.

6. The method of claim 4, wherein the etch rate of the capping layer material is at least five times higher than the etch rate of the native oxide.

7. The method of claim 4, wherein the etch rate of the capping layer material is at least fifteen times higher than the etch rate of the native oxide.

8. The method of claim 4, wherein the capping layer material comprises silver or gold.

9. The method of claim 4, wherein the capping layer material comprises a metal having a thickness such that the metal behaves as a superconductor material due to the superconductivity proximity effect when the electrical contact junction is cooled below a critical temperature of the superconductor material of the first layer.

10. The method of claim 9, wherein the thickness of the metal is between about 5 nm and about 10 nm.

11. The method of claim 4, wherein the capping layer material comprises a superconductor material.

12. The method of claim 11, wherein the superconductor material of the capping layer comprises titanium nitride, rhenium, or ruthenium.

13. The method of claim 1, wherein the superconductor material of the first layer comprises aluminum.

14. The method of claim 1, wherein the superconductor material of the second layer comprises aluminum.

15. A device comprising:
a substrate;
a first layer of superconductor material on the substrate, the first layer of superconductor material having first and second opposing surfaces, wherein the second surface faces away from the substrate;
a capping layer in contact with the second surface of the first layer of superconductor material, wherein a region of the second surface of the first layer of superconductor material in contact with the capping layer is free of a native oxide of the superconductor material,
wherein the capping layer comprises a material that is associated with an ion milling etch rate that, at a set of predetermined ion beam parameters, is higher than an ion milling etch rate associated with the native oxide of the superconductor material of the first layer at the same set of predetermined ion beam parameters,
wherein a thickness of the capping layer is between about 5 nm and about 10 nm; and
a second layer of superconductor material in contact with the capping layer.

16. The device of claim 15 wherein the first layer of superconductor material, the capping layer, and the second layer of superconductor material form an electrical contact junction that allows DC current to flow unimpeded.

17. The device of claim 16, wherein the capping layer material comprises a metal having a thickness such that the metal behaves as a superconductor material due to the superconductivity proximity effect when the electrical contact junction is cooled below a critical temperature of the superconductor material of the first layer.

18. The device of claim 15, wherein the etch rate associated with the capping layer material is at least five times higher than the etch rate of the native oxide of the superconductor material of the first layer.

19. The device of claim 15, wherein the ion milling etch rate associated with the capping layer material is at least fifteen times higher than the ion milling etch rate of the native oxide of the superconductor material of the first layer.

20. The device of claim 15, wherein the ion milling etch rate associated with the capping layer material is at least fifteen times higher than the ion milling etch rate of the native oxide of the superconductor material of the first layer.

21. The device of claim 15, wherein the capping layer material comprises a metal having a thickness such that the metal behaves as a superconductor material due to the superconductivity proximity effect when the electrical contact junction is cooled below a critical temperature of the superconductor material of the first layer.

22. The device of claim 15, wherein the capping layer material comprises a superconductor material.

23. The device of claim 22, wherein the capping layer material comprises titanium nitride, rhenium, or ruthenium.

24. The device of claim 15, wherein the superconductor material of the first layer is aluminum.

25. The device of claim 15, wherein the superconductor material of the second layer is aluminum.

26. The device of claim 15, wherein the device is a qubit.

27. The device of claim 15, wherein the device is a capacitor.

28. The device of claim 15, wherein the device is a cross-over bridge.

29. A method of fabricating an electrical contact junction that allows a current to flow, the method comprising:
providing a substrate comprising a first layer of superconductor material;
removing a native oxide of the superconductor material of the first layer from a first region of the first layer;
forming a capping layer in contact with the first region of the first layer, wherein the capping layer prevents reformation of the native oxide of the superconductor material in the first region,
wherein the capping layer comprises a material that, when subject to ion milling at a predetermined set of ion beam parameters, has an etch rate that is higher than an etch rate of the native oxide subject to the same predetermined set of ion beam parameters;
forming, after forming the capping layer, a second layer of superconductor material that electrically connects to the first region of the first layer of superconductor material to provide the electrical contact junction that allows current to flow.

30. The method of claim 29, wherein a thickness of the capping layer is between about 5 nm and about 10 nm.

* * * * *